United States Patent [19]

Heck et al.

[11] Patent Number: 5,077,491
[45] Date of Patent: Dec. 31, 1991

[54] LOW STANDBY CURRENT COMPARATOR HAVING A ZERO TEMPERATURE COEFFICIENT WITH HYSTERISIS

[75] Inventors: Karl R. Heck, Phoenix; Robert B. Jarrett, Tempe; John M. Pigott, Phoenix, all of Ariz.

[73] Assignee: Motorola, Inc., Schaumburg, Ill.

[21] Appl. No.: 620,176

[22] Filed: Nov. 30, 1990

[51] Int. Cl.$^5$ .................. H03K 5/22; H03K 5/153; H03F 1/30

[52] U.S. Cl. ................... 307/354; 307/360; 307/491

[58] Field of Search ............. 307/354, 360, 491, 494

[56] References Cited

U.S. PATENT DOCUMENTS

| | | | |
|---|---|---|---|
| 4,072,870 | 2/1978 | Davis | 307/354 |
| 4,122,362 | 10/1978 | Hofmann | 307/360 |
| 4,132,909 | 1/1979 | Nutz | 307/354 |
| 4,324,990 | 4/1982 | Gay | 307/354 |
| 4,429,234 | 1/1984 | Streit | 307/360 |
| 4,710,793 | 12/1987 | Gray | 307/360 |

FOREIGN PATENT DOCUMENTS 0065614  4/1985  Japan .......................... 307/360

*Primary Examiner*—Eugene R. LaRoche
*Assistant Examiner*—Evelyn A. Lester
*Attorney, Agent, or Firm*—Robert D. Atkins; Michael D. Bingham

[57] ABSTRACT

A comparator circuit is provided compatible with CMOS logic levels for the input signal and including a substantially zero standby current when the input signal is initially less than the upper trip threshold. The trip threshold follows a bandgap voltage with a zero temperature coefficient, while hysterisis is provided with the upper and lower trip thresholds. An alternate embodiment of the comparator circuit provides a selectable zero temperature coefficient for the trip threshold as a ratio of emitter resistors while maintaining the hysterisis with the upper and lower trip thresholds.

14 Claims, 1 Drawing Sheet 5,077,491

LOW STANDBY CURRENT COMPARATOR HAVING A ZERO TEMPERATURE COEFFICIENT WITH HYSTERISIS

FIELD OF THE INVENTION

This invention relates in general to a comparator circuit combining low standby current with a substantially zero temperature coefficient and hysterisis for the trip threshold thereof.

BACKGROUND OF THE INVENTION

The application of comparator circuits is commonplace in modern electronic design. In general, a comparator circuit compares an input signal against a predetermined threshold and switches between output states depending on whether the input signal is above or below the trip threshold. Some of the desirable properties of a comparator circuit include a substantially zero temperature coefficient, hysterisis about the trip threshold, and a low standby current drain from the power supply. The substantially zero temperature coefficient of the comparator circuit ensures that the trip threshold does not vary with temperature which is especially useful in applications involving wide temperature variation. The hysterisis about the trip threshold establishes an upper threshold which the input signal must exceed before the comparator circuit transitions to the high output state and a lower threshold which the input signal must fall below before converting back to the low output state. The hysterisis provides noise immunity by preventing the output signal of the comparator circuit from toggling between high and low states if the input signal varies slightly about the trip threshold. The low standby current is useful in battery applications, for example in automotive designs, wherein it is desirable for the comparator circuit to draw substantially zero current from the power supply when the input signal is below the trip threshold thereby avoiding unnecessary drain from the battery source. In many applications such as the automotive example, another desirable property of the comparator circuit is compatibility with CMOS logic levels for interfacing to conventional control circuits such as a microprocessor. Most if not all conventional comparators fail to combine the aforedescribed features in a single operational circuit.

Hence, what is needed is an improved comparator circuit operating with a substantially zero temperature coefficient with hysterisis about the trip threshold point while drawing substantially zero current in standby mode.

SUMMARY OF THE INVENTION

Briefly stated, the invention comprises a comparator circuit comprising a first transistor having an emitter coupled for receiving an input signal and a base coupled to its first collector. A second transistor includes a base and a collector coupled together and an emitter coupled to a first source of operating potential. A first resistor is coupled between the first collector of the first transistor and the collector of the second transistor, and a third transistor includes a base coupled to the base of the second transistor and a collector coupled to the second collector of the first transistor, while a second resistor is coupled between the first emitter of the third transistor and the first source of operating potential. A fourth transistor is provided having an emitter coupled to the first source of operating potential, a base coupled to the second collector of the first transistor and a collector for providing an output signal when the input signal exceeds a first predetermined threshold. The output signal is substantially zero when the input signal is less than a second predetermined threshold.

In one embodiment, the comparator circuit of the present invention is compatible with CMOS logic levels for the input signal and includes a substantially zero standby current when the input signal is initially less than the upper trip threshold. The trip threshold follows the bandgap voltage with a zero temperature coefficient, while hysterisis is provided with the upper and lower trip thresholds. Furthermore, the comparator circuit may be configured with a selectable zero temperature coefficient for the trip threshold as a function of emitter resistors while maintaining the hysterisis with the upper and lower trip thresholds.

DETAILED DESCRIPTION OF THE PREFERRED EMBODIMENT

Figure 1:
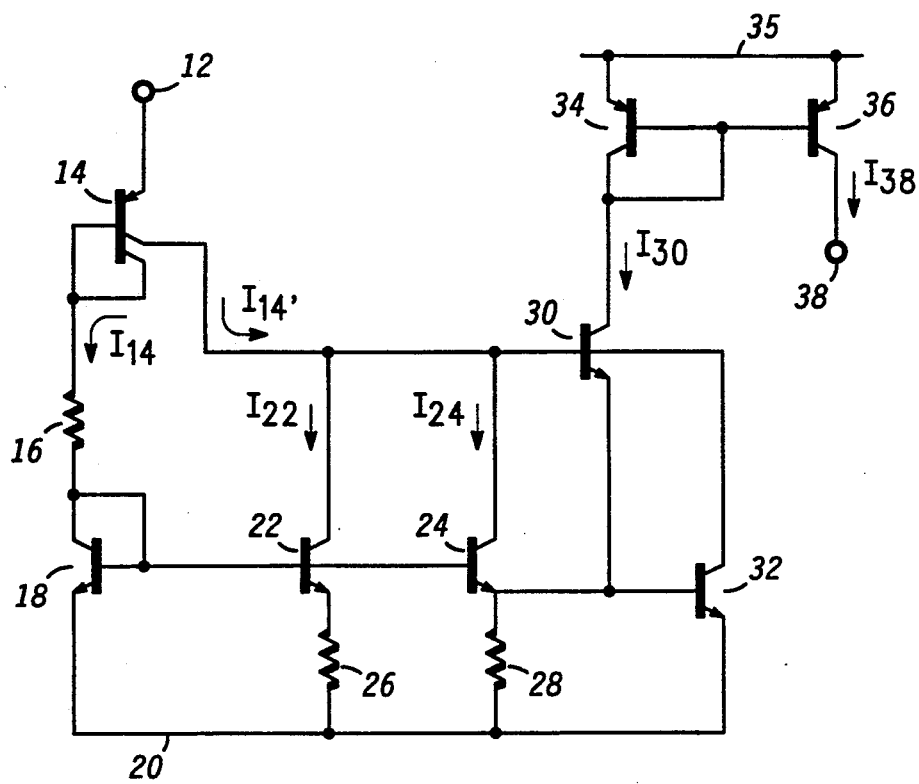
FIG. 1 is a schematic diagram illustrating the preferred embodiment of the present invention.

Referring to FIG. 1, there is shown comparator circuit 10 suitable for manufacturing in monolithic integrated circuit form using conventional integrated circuit processes. An input signal having CMOS logic levels (1.5 to 3.5 volts) is applied at input 12 at the emitter of transistor 14. The base of transistor 14 is coupled to the first collector of the same and through resistor 16 to the collector and base of transistor 18. The emitter of transistor 18 continues to power supply conductor 20 typically operating at ground potential. The base of transistor 18 is also coupled to the bases of transistors 22 and 24, while the emitters thereof are coupled through resistors 26 and 28, respectively, to power supply conductor 20. The collectors of transistors 22 and 24 are coupled together to the second collector of transistor 14 and to the base of transistor 30. Transistor 32 includes a base coupled to the emitters of transistors 24 and 30, a collector coupled to the base of transistor 30 and an emitter coupled to power supply conductor 20. The collector of transistor 30 is coupled to the collector and base of transistor 34 which also includes an emitter coupled to power supply conductor 35 operating at a positive potential such as $V_{CC}$. Transistor 36 includes a base coupled to the base of transistor 34, an emitter coupled to power supply conductor 35 and a collector coupled to output 38 for providing output current $I_{38}$ proportional to current $I_{30}$ flowing through transistor 30 as transistors 34 and 36 form a PNP current mirror circuit.

The operation of comparator circuit 10 proceeds as follows. First consider the operation where the input signal applied at input 12 is a CMOS logic low such that the potential at the emitter of transistor 14 is less than two base-emitter junction potentials (2 $V_{be}$) above power supply conductor 20. For a low input signal, transistor 14 is non-conductive and the currents $I_{14}$ and $I_{14}'$ flowing in the first and second collectors thereof are zero. There is no base current to drive transistor 30 and the potential developed at its base is low. Transistor 30 is thus non-conductive and currents $I_{30}$ and $I_{38}$ flowing in transistors 34 and 36, respectively, are zero. Transistors 18, 22, 24 and 32 are also non-conductive. Thus while the input signal is low for standby mode (less than 2 $V_{be}$), comparator circuit 10 draws no current from power supply conductors 20 and 35 and consumes substantially zero power.

As the input signal applied at input 12 increases and exceeds the $V_{be}$ of transistor 14 plus the $V_{be}$ of transistor 18, transistor 14 begins to conduct. At the point where transistor 14 begins to conduct, the input signal is still below the trip threshold of comparator circuit 10 and currents $I_{14}$ and $I_{14}'$ flowing through the first and second collectors of transistor 14 are initially small. Current $I_{14}$ flows through resistor 16 and transistor 18 while current $I_{14}'$ splits between the collector-emitter conduction paths of transistors 22 and 24. Transistors 18, 22 and 24 approximate the operation of a current mirror with small currents flowing in the first and second collectors of transistor 14 since there is negligible drop across resistors 26 and 28. The combination of transistors 22 and 24 may be formed of a single transistor having double emitters with a total emitter area of N. The emitter area of transistor 24 is M and the emitter area of transistor 22 is N-M. The values of N and M and the values of resistors 26 and 28 are selected such that the emitters of transistors 22 and 24 have equal current densities. Hence, transistors 22 and 24 draw more current with substantially the same $V_{be}$ as transistor 18 given their larger emitter areas. Therefore, transistors 22 and 24 quickly saturate as together they attempt to sink a current greater than current $I_{14}$ flowing through transistor 18 even though only current $I_{14}'$ is available for both. Thus, transistor 30 remains non-conductive as the input signal reaches a level of two $V_{be}$.

When the input signal increases slightly more approaching the trip threshold point, more current flows through transistor 14 and through transistors 22 and 24 thereby developing an appreciable potential across resistors 26 and 28 which subtracts from the $V_{be}$ of transistors 22 and 24. The trip threshold of comparator circuit 10 is defined at the point where current $I_{14}$ is equal to the sum of the currents $I_{22}+I_{24}$ as transistors 22 and 24 recover from saturation. Current $I_{22}$ flows through transistor 22 and current $I_{24}$ flows through transistor 24. When the input signal reaches the trip threshold, the potential at the base of transistor 30 increases as transistors 22 and 24 withdraw from saturation. A base current flows into transistor 30 turning it on and drawing current $I_{30}$ through transistors 34 and 30. The current $I_{30}$ increases the potential at the base of transistor 32, reverse biasing the base-emitter junction of transistor 24 thereby turning it off which turns transistor 30 on even harder as current $I_{14}'$ flowing in the second collector of transistor 14 loses the conduction path through transistor 24. This provides the hysterisis about the trip threshold point of comparator circuit 10 since the input signal must drop to a level where current $I_{14}'$ is equal to current $I_{22}$ alone before transistor 30 becomes non-conductive. Thus, the upper trip threshold occurs when the input signal reaches a level such that $I_{14}=I_{22}+I_{24}$, and the lower trip threshold occurs when the input signal reduces where $I_{14}=I_{22}$. Furthermore, transistor 32 limits the potential developed at the emitter of transistor 24 to one $V_{be}$ and the potential at the base of transistor 30 to two $V_{be}$ each above power supply conductor 20 thereby limiting current $I_{30}$ flowing through transistor 30 to a value equal to the $V_{be}$ of transistor 32 divided by $R_{28}(V_{be32}/R_{28})$, where $R_{28}$ is the resistance of resistor 28. The PNP current mirror formed of transistors 34 and 36 reflects the same current $I_{38}$ through output 38.

The upper trip threshold, $V_{12}+$, may be calculated from $I_{14}=I_{22}+I_{24}$ as follows:

$$I_{14} = (V_{12}^+ - 2^*V_{be})/R_{16} \quad (1)$$

$$I_{14} = I_{22} + I_{24} = [(KT/q)/(R_{26}^* (N - M)/N)] * \ln(N)$$

$$[(KT/q)/(R_{26}^* (N - M)/N)] * \ln(N) = (V_{12}^+ - 2^*V_{be})/R_{16} \quad (2)$$

where:

$V_{be}$ is the base-emitter junction potential of transistors 14 and 18
$R_{16}$ is the value of resistor 16
$R_{26}$ is the value of resistor 26
K is Boltzmann's constant
T is absolute temperature
q is the electron charge The typical implementation of transistors 22 and 24 is a single transistor with double emitters having a total emitter area of N and an equivalent emitter resistance $R_{EQ}=R_{26}^*(N-M)/N$. Substituting equivalent resistance $R_{EQ}$ and solving Equation (2) for $V_{12}+$ yields:

$$V_{12}+ = (R_{16}/R_{EQ})^*(KT/q)^* \ln(N) + 2^*V_{be} \quad (3)$$

For a zero temperature coefficient of the trip threshold, the derivative of upper trip threshold $V_{12}+$ with respect to temperature T is set to zero and the result is solved for $R_{EQ}$, neglecting the variation of resistor values with temperature or assuming that the temperature coefficients of the resistors cancel.

$$\delta V_{12}+/\delta T = (R_{16}/R_{EQ})^*(K/q)^* \ln(N) + 2^*\delta V_{be}/\delta T = 0 \quad (4)$$

$$R_{EQ} = -[R_{16}^*K^* \ln(N)]/[2q^*\delta V_{be}/\delta T] \quad (5)$$

Assuming that $\delta V_{be}/\delta T \approx (V_{beO}-V_{GO})/T_O$ for a first order estimation, where $V_{beO}$ is the base-emitter junction potential of transistors 14 and 18 at temperature $T_O$ of 300° K. and $V_{GO}$ is the bandgap voltage of transistors 22 and 24 at 300° K., Equation (5) simplifies to:

$$V_{12}+ = 2^*V_{GO} \quad (6)$$

Therefore, with proper selection of N, M, $R_{16}$ and $R_{26}$, comparator circuit 10 provides a zero temperature coefficient for the upper trip threshold of say 2.5 volts. A possible set of values may be N=6, M=1, $R_{16}=3K$ and $R_{26}=65K$.

Using a similar derivation, the lower trip threshold, $V_{12}-$, without transistor 24 conducting is calculated from:

$$V_{12}- = R_{16}/R_{26}^*(KT/q)^* \ln(N-M) + 2^*V_{be} \quad (7)$$

It can be shown by repeating Equations (4) through (6), the lower trip threshold $V_{12}-$ is approximately 200 millivolts below the upper trip threshold, or about 2.3 volts.

Thus, some of the key features of comparator circuit 10 include substantially zero standby current when the input signal is initially less than the upper trip threshold and a zero temperature coefficient for the trip threshold as a function of the bandgap voltage. The hysterisis is provided with the upper and lower trip thresholds including compatibility with CMOS logic levels for the input signal.

Figure 2:
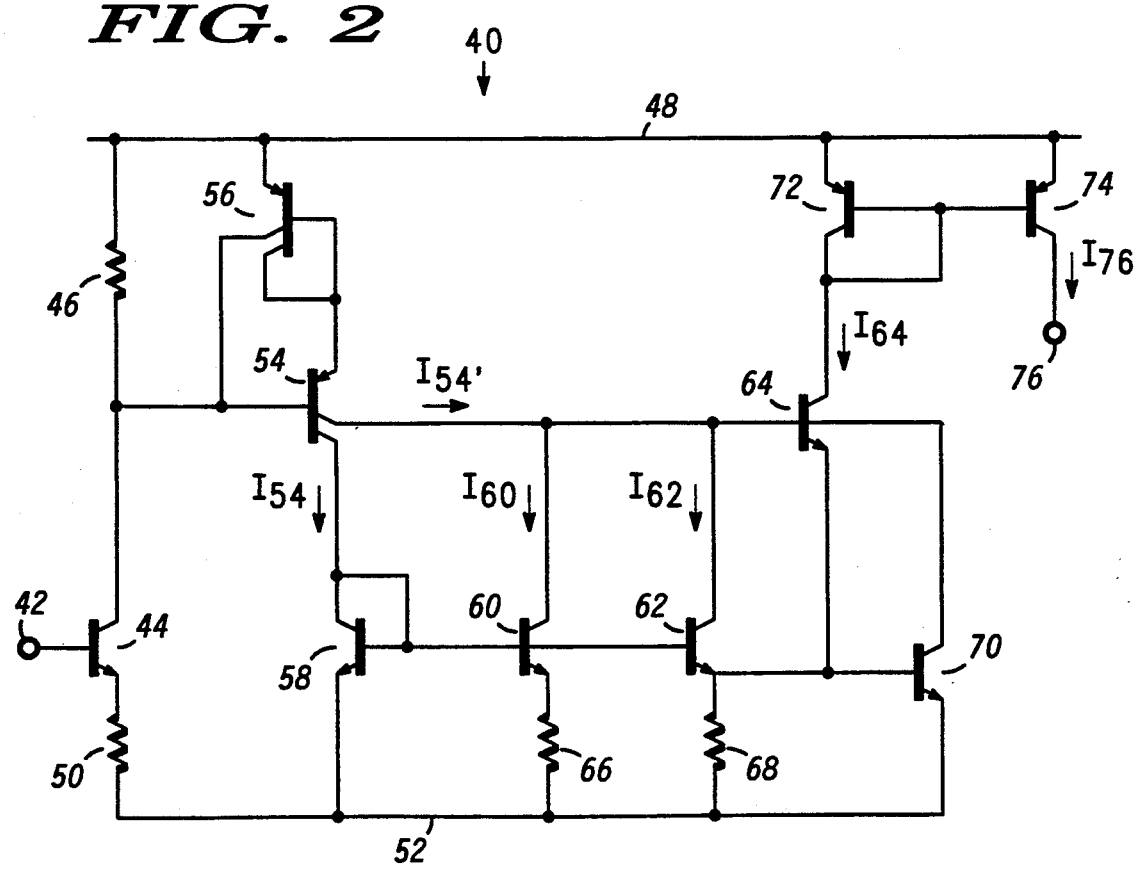
FIG. 2 is a schematic diagram illustrating an alternate embodiment of the present invention.

Turning to FIG. 2, there is shown an alternate embodiment of the present invention as comparator circuit 40 including input 42 coupled for receiving an input signal at the base of transistor 44. The collector of transistor 44 is coupled through resistor 46 to power supply conductor 48 typically operating at a positive potential such as $V_{CC}$, while the emitter of transistor 44 is coupled through resistor 50 to power supply conductor 52 operating at ground potential. The collector of transistor 44 is also coupled to the base of transistor 54 and to the first collector of transistor 56, while the emitter of transistor 54 is coupled to the second collector and base of transistor 56. The emitter of transistor 56 is coupled to power supply conductor 48, and the first collector of transistor 54 is coupled to the collector and base of diode-configured transistor 58. The emitter of transistor 58 continues to power supply conductor 52. The second collector of transistor 54 is coupled to the collectors of transistors 60 and 62 and to the base of transistor 64, while the bases of transistors 60 and 62 are coupled to the base of transistor 58. The emitters of transistors 60 and 62 are coupled through resistors 66 and 68, respectively, to power supply conductor 52. Transistor 70 includes a collector coupled to the base of transistor 64, a base coupled to the emitters of transistors 62 and 64, and an emitter coupled to power supply conductor 52. The collector of transistor 64 is coupled to the collector and base of transistor 72 which includes an emitter coupled to power supply conductor 48. The base of transistor 72 is also coupled to the base of transistor 74 for providing an output current $I_{76}$ flowing through the collector-emitter conduction path of transistor 76 equal to that flowing through transistor 64 as transistors 72 and 74 form a PNP current mirror circuit.

For applications requiring a higher input impedance, comparator circuit 40 provides such an input stage function with transistors 44 and 56. The input impedance of comparator circuit 40 is the forward current gain $\beta$ times resistor 50, say 10 megaohms or better. By comparison, the input impedance of comparator circuit 10 may be in the kilo-ohm range depending on device technology. Moreover, the embodiment of FIG. 2 provides a selectable zero temperature coefficient for the trip threshold as a function of resistors 46 and 50, whereas comparator circuit 10 is solely a dependent upon the bandgap voltage of transistors 22 and 24. Comparator circuit 40 maintains the hysterisis about the trip threshold; however, the input stage is no longer restricted to CMOS compatible logic levels. Thus, there is some trade-off between the embodiments of FIG. 1 and FIG. 2.

First consider the operation of comparator circuit 40 where a low input signal is applied at input 42. Transistor 44 is rendered non-conductive and the base of transistor 54 is pulled high through resistor 46 turning the latter off. The current $I_{54}$ and $I_{54}'$ flowing in the first and second collectors thereof are thus zero. There is no base current to drive transistor 64 and the potential developed at its base is low. Transistor 64 is thus non-conductive and currents $I_{64}$ and $I_{76}$ flowing through transistor 64 and output 76, respectively, are also zero. In addition, transistors 58, 60, 62 and 70 are non-conductive.

As the input signal applied at input 42 increases, transistor 54 begins to conduct as the input signal reaches the $V_{be}$ of transistor 44 although the input signal is still below the trip threshold of comparator circuit 40. Transistors 54 and 56 are configured as one-to-one current sources. That is, the second collector of transistor 56 supplies currents $I_{54}$ and $I_{54}'$ flowing through the first and second collectors of transistor 54, while the emitter of transistor 54 supplies the base of transistor 56. Otherwise, the operation of transistors 58–74 behaves much as described for transistors 18–36 of FIG. 1. Briefly, the currents $I_{54}$ and $I_{54}'$ flowing through the first and second collectors of transistors 14 begin initially small whereby transistors 60 and 62 saturate as together they attempt to sink current greater than that flowing through transistor 58. The combination of transistors 60 and 62 may be formed of a single transistor having double emitters with a total emitter area of N. Again, the emitter area of transistor 62 is M and the emitter area of transistor 60 is N-M. The values of N and M and the values of resistors 66 and 68 are selected such that the emitters of transistors 60 and 62 have equal current densities. Thus, transistor 64 remains non-conductive as the signal at the base of transistor 64 is less than a $V_{be}$.

As the input signal increases slightly more approaching the trip threshold point, more current flows through transistor 58 and through transistors 60 and 62, thereby developing an appreciable potential across resistors 66 and 68 which subtracts from the $V_{be}$ potential of transistors 60 and 62. When the input signal reaches the trip threshold where current $I_{54}$ is equal to the sum of the currents $I_{60}+I_{62}$, the potential at the base of transistor 64 increases as transistors 60 and 62 withdraw from saturation. A base current flows into transistor 64 turning it on and drawing current $I_{64}$ through transistors 72 and 64. The PNP current mirror formed of transistors 72 and 74 reflects the same current $I_{76}$ through output 76.

The current $I_{64}$ increases the potential at the base of transistor 70, reverse biasing the base-emitter junction of transistor 62 thereby turning it off which turns transistor 64 on even harder as the current $I_{54}'$ flowing in the second collector of transistor 54 loses the conduction path through transistor 62. This provides the hysterisis about the trip threshold point of comparator circuit 40 since the input signal must drop to a level such that current $I_{54}$ is equal to current $I_{60}$ alone before transistor 64 becomes non-conductive. Furthermore, transistor 70 limits the potential developed at the emitter of transistor 62 to one $V_{be}$ and the potential at the base of transistor 64 to two $V_{be}$ each above power supply conductor 52. This limits current $I_{64}$ flowing through transistor 64 and the output current $I_{76}$ flowing through output 76 to a value equal to the $V_{be}$ of transistor 70 divided by $R_{68}(V_{be70}/R_{68})$, where $R_{68}$ is the resistance of resistor 68.

The upper trip threshold may be calculated from $I_{54}=I_{60}+I_{62}$ as follows:

$$I_{54} = (V_{42}^+ - V_{be})/R_{50} - (2 \cdot V_{be})/R_{46} \qquad (8)$$

$$I_{54} = I_{60} + I_{62} = [(KT/q)/(R_{66} \cdot (N-M)/N)] \cdot \ln(N)$$

$$[(KT/q)/(R_{26} \cdot (N-M)/N)] \cdot \ln(N) = \qquad (9)$$

$$(V_{42}^+ - V_{be})/R_{50} - (2 \cdot V_{be})/R_{46}$$

where:
  $V_{42}+$ is the upper trip threshold
  $V_{be}$ is the base-emitter junction potential of transistors 54, 56 and 44
  $R_{50}$ is the value of resistor 50
  $R_{66}$ is the value of resistor 66

Again, the typical implementation of transistors 60 and 62 is a single transistor with double emitters having a total emitter area of N and an equivalent emitter resistance $R_{EQ}=R_{66}*(N-M)/N$. Substituting equivalent resistance $R_{EQ}$ and solving Equation (9) for $V_{42}+$ yields:

$$V_{42}+ = R_{50}/R_{EQ}*(KT/q)*\ln(N)+V_{be}(2*R_{50}/R_{46}+1) \quad (10)$$

For a zero temperature coefficient of the trip threshold, the derivative of the upper trip threshold $V_{42}+$ with respect to temperature T is set to zero and the result is solved for $R_{EQ}$ as follows:

$$\delta V_{42}+/\delta T = R_{50}/R_{EQ}*(K/q)*\ln(N)+(\delta V_{be}/\delta T)*(2*R_{50}/R_{46}+1)=0 \quad (11)$$

$$R_{EQ}= -[R_{50}*(K/q)*\ln(N)]/[(\delta V_{be}/\delta T)*(2*R_{50}/R_{46}+1)] \quad (12)$$

Substituting Equation (12) into Equation (10) with $\delta V_{be}/\delta T \approx (V_{beO}-V_{GO})/T_O$ at 300° K., Equation (12) simplifies to:

$$V_{42}+ = V_{GO}(2*R_{50}/R_{46}+1) \quad (13)$$

The zero temperature coefficient trip threshold of comparator 40 is selectable with resistors 46 and 50, whereas the zero temperature coefficient for the upper trip threshold of comparator circuit 10 is determined solely by the bandgap voltage $V_{GO}$, see Equation (6).

Similarly, it can be shown that the lower zero temperature coefficient trip threshold is obtained from Equation (10) with N-M substituted for N and $R_{66}$ substituted for $R_{EQ}$ as follows:

$$V_{42}- = R_{50}/R_{66}*(KT/q)*\ln(N-M)+V_{be}(2*R_{50}/R_{46}+1) \quad (14)$$

The equivalent resistor $R_{EQ}$ has already been chosen for a zero temperature coefficient for the trip threshold from Equation (12). Substituting Equation (12) with the relationship $R_{EQ}=R_{66}(N-M)/N$ into Equation (14) and simplifying yields the result:

$$V_{42}- = (H*V_{42}+)+V_{be}(2*R_{50}/R_{46}+1)*(1-H) \quad (15)$$

$$H=(N-M)/N*\ln(N-M)/\ln(N)$$

where H is predetermined value less than one as determined from the emitter areas of transistors 60 and 62.

Hence, what has been provided is a novel comparator circuit having substantially zero standby current when the input signal is initially less than the upper trip threshold and a zero temperature coefficient of the trip threshold as a function of the bandgap voltage. The hysterisis is provided with the upper and lower trip thresholds including compatibility with CMOS logic levels for the input signal. Furthermore, an alternate embodiment of the comparator circuit is provided with a selectable zero temperature coefficient for the trip threshold as a function of emitter resistors while maintaining the hysterisis with the upper and lower trip thresholds and substantially zero standby current.

We claim:

1. A comparator circuit, comprising:

a first transistor having an emitter, a base and first and second collectors, said emitter being coupled for receiving an input signal, said base being coupled to said first collector;

a second transistor having a collector, a base and an emitter, said base and collector being coupled together, said emitter being coupled to a first source of operating potential;

a first resistor coupled between said first collector of said first transistor and said collector of said second transistor;

a third transistor having a base, a collector and a first emitter, said base being coupled to said base of said second transistor, said collector being coupled to said second collector of said first transistor;

a second resistor coupled between said first emitter of said third transistor and said first source of operating potential; and a fourth transistor having a base, an emitter and a collector, said emitter being coupled to said first source of operating potential, said base being coupled to said second collector of said first transistor, said collector providing an output signal when said input signal exceeds a first predetermined threshold, said output signal being substantially zero when said input signal is less than a second predetermined threshold.

2. The comparator circuit of claim 1 further including a third resistor coupled between said emitter of said fourth transistor and said first source of operating potential.

3. The comparator circuit of claim 2 wherein said third transistor includes a second emitter coupled to said emitter of said fourth transistor and through said third resistor to said first source of operating potential.

4. The comparator circuit of claim 3 further comprising a fifth transistor having a base, an emitter and a collector, said collector being coupled to said base of said fourth transistor, said base being coupled to said second emitter of said third transistor and to said emitter of said fourth transistor, said emitter being coupled to said first source of operating potential.

5. The comparator circuit of claim 4 further comprising;

a sixth transistor having a base, an emitter and a collector, said emitter being coupled to a second source of operating potential, said base and collector being coupled together to said collector of said fourth transistor; and a seventh transistor having a base emitter and a collector, said emitter being coupled to said second source of operating potential, said base being coupled to said base of said sixth transistor, said collector providing an output signal proportional to said output signal of said fourth transistor.

6. A comparator circuit, comprising:

an input stage having a high impedance input terminal coupled for receiving an input signal and having an output for providing an output signal operating in accordance with said input signal;

a first transistor having an emitter, a base and first and second collectors, said emitter being coupled for receiving a first source of operating potential, said base being coupled for receiving said output signal of said input stage;

a second transistor having a collector, a base and an emitter, said base and collector being coupled together to said first collector of said first transistor, said emitter being coupled to a second source of operating potential;

a third transistor having a base, a collector and a first emitter, said base being coupled to said base of said second transistor, said collector being coupled to said second collector of said first transistor;

a first resistor coupled between said first emitter of said third transistor and said second source of operating potential; and a fourth transistor having a base, an emitter and a collector, said base being coupled to said second collector of said first transistor, said emitter being coupled to said second source of operating potential, said collector providing an output signal when said input signal exceeds a first predetermined threshold, said output signal being substantially zero when said input signal is less than a second predetermined threshold.

7. The comparator circuit of claim 6 further including a second resistor coupled between said emitter of said fourth transistor and said second source of operating potential.

8. The comparator circuit of claim 7 wherein said third transistor includes a second emitter coupled to said emitter of said fourth transistor and through said second resistor to said second source of operating potential.

9. The comparator circuit of claim 8 further comprising a fifth transistor having a base, an emitter and a collector, said collector being coupled to said base of said fourth transistor, said base being coupled to said second emitter of said third transistor and to said emitter of said fourth transistor, said emitter being coupled to said second source of operating potential.

10. The comparator circuit of claim 9 wherein said input stage comprises;

a sixth transistor having a collector, an emitter and a base, said base being coupled for receiving said input signal of the comparator circuit, said collector being coupled to said base of said first transistor;

a third resistor coupled between said emitter of said sixth transistor and said second source of operating potential;

a fourth resistor coupled between said collector of said sixth transistor and said first source of operating potential; and a seventh transistor having a base emitter and first and second collectors, said emitter being coupled to said first source of operating potential, said first collector being coupled to said base of said first transistor, said base and said second collector being coupled together to said emitter of said first transistor.

11. The comparator circuit of claim 10 further comprising;

an eighth transistor having a base, an emitter and a collector, said emitter being coupled to said first source of operating potential, said base and collector being coupled together to said collector of said fourth transistor; and a ninth transistor having a base emitter and a collector, said emitter being coupled to said first source of operating potential, said base being coupled to said base of said eighth transistor, said collector providing an output signal proportional to said output signal of said fourth transistor.

12. In an integrated circuit a comparator, comprising:

a first transistor having an emitter, a base and first and second collectors, said emitter being coupled for receiving an input signal, said base being coupled to said first collector;

a second transistor having a collector, a base and an emitter, said base and collector being coupled together, said emitter being coupled to a first source of operating potential;

a first resistor coupled between said first collector of said first transistor and said collector of said second transistor;

a third transistor having a base, a collector and first and second emitters, said base being coupled to said base of said second transistor, said collector being coupled to said second collector of said first transistor;

a second resistor coupled between said first emitter of said third transistor and said first source of operating potential;

a fourth transistor having a base, an emitter and a collector, said base being coupled to said second collector of said first transistor, said emitter being coupled to said second emitter of said third transistor, said collector providing an output signal when said input signal exceeds a first predetermined threshold, said output signal being substantially zero when said input signal is less than a second predetermined threshold; and a third resistor coupled between said second emitter of said third transistor and said first source of operating potential.

13. The comparator of claim 12 further comprising a fifth transistor having a base, an emitter and a collector, said collector being coupled to said base of said fourth transistor, said base being coupled to said second emitter of said third transistor and to said emitter of said fourth transistor, said emitter being coupled to said first source of operating potential.

14. The comparator of claim 13 further comprising:

a sixth transistor having a base, an emitter and a collector, said emitter being coupled to a second source of operating potential, said base and collector being coupled together to said collector of said fourth transistor; and a seventh transistor having a base emitter and a collector, said emitter being coupled to said second source of operating potential, said base being coupled to said base of said sixth transistor, said collector providing an output signal proportional to said output signal of said fourth transistor.

* * * * *

UNITED STATES PATENT AND TRADEMARK OFFICE
CERTIFICATE OF CORRECTION

PATENT NO. : 5,077,491
DATED : December 31, 1991
INVENTOR(S) : HECK, Karl R., JARRETT, Robert B. and PIGOTT, John M.

It is certified that error appears in the above-identified patent and that said Letters Patent is hereby corrected as shown below:

Col. 4, line 10, please delete Equation (2) in its entirety and insert
$--I_{14}=I_{22}+_{24}=[(KT/q)/R_{26}*(N-M)/N]*ln(N)=(V_{12}+-2*V_{be})/R_{16}--$.

Col. 6, lines 60-61, please delete Equation (9) in its entirety and insert
$--I_{54}=I_{60}+I_{62}=[(KT/q)/R_{66}*(N-M)/N]*ln(N)=(V_{42}+-V_{be})/R_{50}-(2*V_{be})/R_{46}--$.

Signed and Sealed this

Fourth Day of May, 1993

Attest:

MICHAEL K. KIRK

Attesting Officer

Acting Commissioner of Patents and Trademarks